US005620933A

United States Patent [19]

James et al.

[11] Patent Number: 5,620,933

[45] Date of Patent: Apr. 15, 1997

[54] MICROMACHINED RELAY AND METHOD OF FORMING THE RELAY

[75] Inventors: Christopher D. James, Carlsbad; Henry S. Katzenstein, Arroyo Grande, both of Calif.

[73] Assignee: Brooktree Corporation, San Diego, Calif.

[21] Appl. No.: 445,139

[22] Filed: May 19, 1995

Related U.S. Application Data

[62] Division of Ser. No. 12,055, Feb. 1, 1993, Pat. No. 5,479, 042.

[51] Int. Cl.[6] ........................ H01L 21/461; H01L 21/465

[52] U.S. Cl. .............................. 216/2; 437/901; 437/921; 437/927; 438/53; 438/51; 438/456; 438/739; 216/20; 216/33

[58] Field of Search .................................... 437/225, 228, 437/249, 901, 228 H, 228 O, 921, 927; 361/8, 13, 100, 101; 156/644.1; 148/DIG. 73, DIG. 159; 257/276, 522

[56] References Cited

U.S. PATENT DOCUMENTS

| | | | |
|---|---|---|---|
| 3,577,631 | 5/1971 | Bylander | 437/249 |
| 4,472,239 | 9/1984 | Johnson et al. | 437/249 |
| 5,155,061 | 10/1992 | O'Connor et al. | 437/901 |

*Primary Examiner*—Mary Wilczewski
*Assistant Examiner*—Brian K. Dutton
*Attorney, Agent, or Firm*—Ellsworth R. Roston; Charles H. Schwartz

[57] ABSTRACT

A bridging member extending across a cavity in a semiconductor substrate (e.g. single crystal silicon) has successive layers—a masking layer, an electrically conductive layer (e.g. polysilicon) and an insulating layer (e.g. $SiO_2$). A first electrical contact (e.g. gold coated with ruthenium) extends on the insulating layer in a direction perpendicular to the extension of the bridging member across the cavity. A pair of bumps (e.g. gold) are on the insulating layer each between the contact and one of the cavity ends. Initially the bridging member and then the contact and the bumps are formed on the substrate and then the cavity is etched in the substrate through holes in the bridging member. A pair of second electrical contacts (e.g. gold coated with ruthenium) are on the surface of an insulating substrate (e.g. pyrex glass) adjacent the semiconductor substrate. The two substrates are bonded after the contacts are cleaned. The first contact is normally separated from the second contacts because the bumps engage the insulating substrate surface. When a voltage is applied between an electrically conductive layer on the insulating substrate surface and the polysilicon layer, the bridging member is deflected so that the first contact engages the second contacts. Electrical leads extend on the surface of the insulating substrate from the second contacts to bonding pads disposed adjacent a second cavity in the semiconductor substrate. The resultant relays on a wafer may be separated by sawing the semiconductor and insulating substrates at the position of the second cavity in each relay to expose the pads for electrical connections.

31 Claims, 4 Drawing Sheets

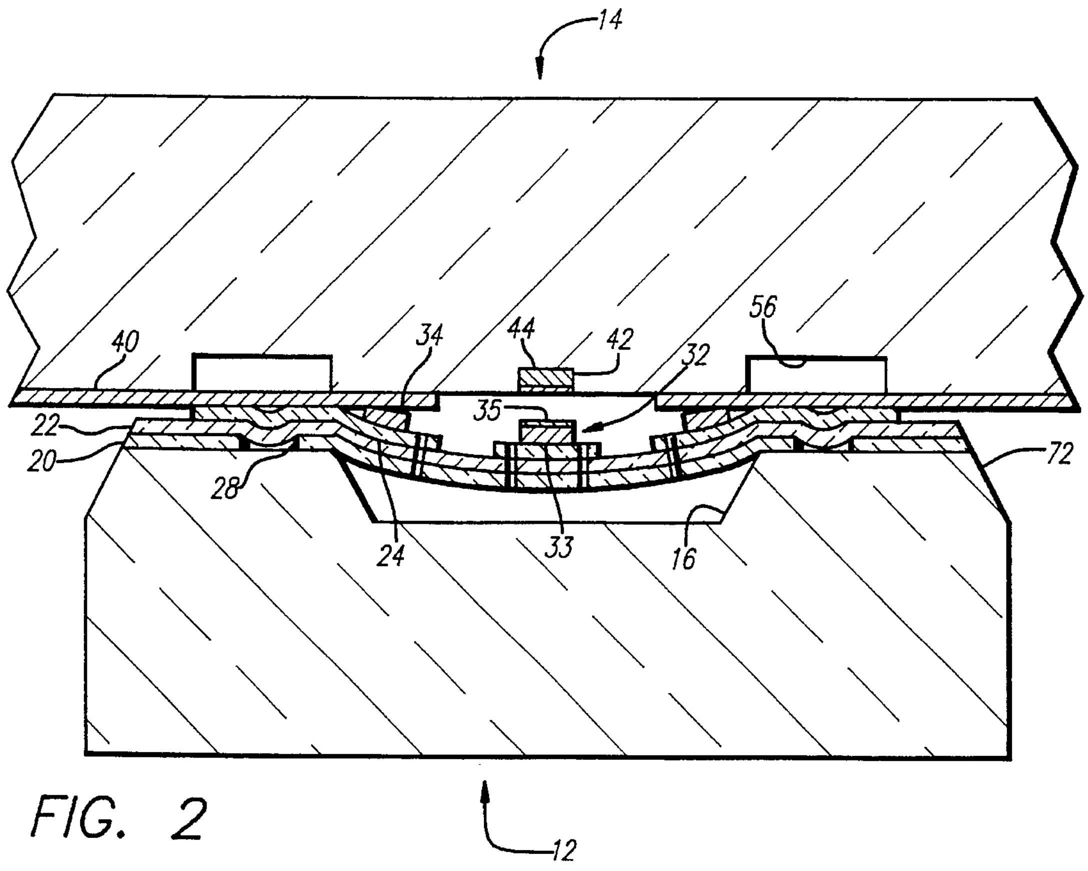
FIG. 2
FIG. 3
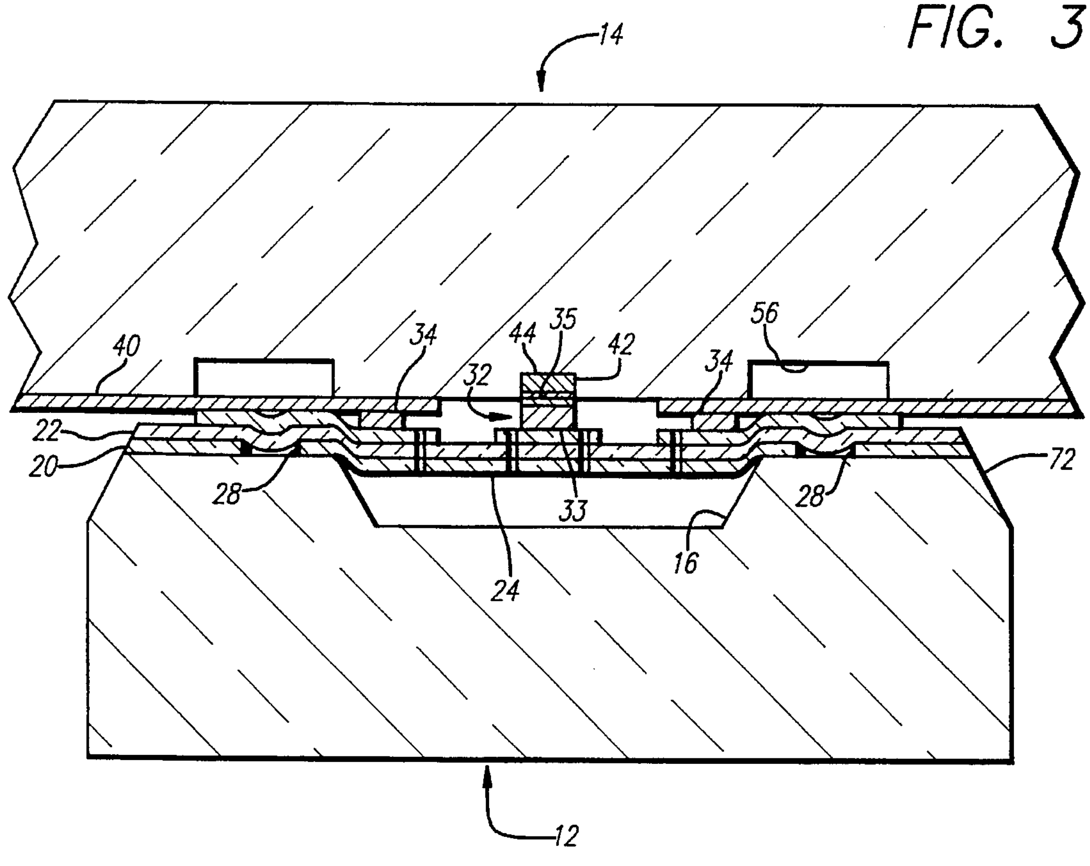

MICROMACHINED RELAY AND METHOD OF FORMING THE RELAY

This is a division of application Ser. No. 08/012,055, filed Feb. 1, 1993 now U.S. Pat. No. 5,479,042 issued Dec. 26, 1995.

This invention relates to micromachined relays made from materials such as semiconductor materials. The invention also relates to methods of fabricating such relays.

Electrical relays are used in a wide variety of applications. For example, electrical relays are used to close electrical circuits or to establish selective paths for the flow of electrical current. Electrical relays have generally been formed in the prior art by providing an electromagnet which is energized to attract a first contact into engagement with a second contact. Such relays are generally large and require a large amount of power, thereby producing a large amount of heat. Furthermore, since the magnetic fields cannot be easily confined, they tend to affect the operation of other electrical components in the magnetic fields. To prevent other electrical components from being affected by such magnetic fields, such other components are often displaced from the magnetic fields. This has resulted in long electrical leads and resultant increases in parasitic capacitances. The circuits including the electrical relays have thus been limited in their frequency responses.

As semiconductor chips have decreased in size, their frequency responses have increased because of the decreases in the sizes of the transistors in the semiconductor chips. Furthermore, the number of transistors in the semiconductor chips has increased even as the sizes of the semiconductor chips have decreased. The resultant increases in the complexities of the circuits on the chips have necessitated an increase in the number of pads communicating on the chips with electrical circuitry external to the chips even as the sizes of the chips have decreased. The problems of testing the chips for acceptance have accordingly been compounded because of the decreased sizes of the chips, the increased frequency responses of the chips and the increased number of bonding pads on the chips.

All of the parameters specified in the previous paragraph have dictated that relays in the equipment for testing the chips should have a minimal size, an optimal frequency response, a reliable operation and a low consumption of power. These parameters have become increasingly important because the number of relays in the testing equipment has multiplied as the circuitry on the chips has become increasingly complex and the number of pads on the chips has increased. These parameters have made it apparent that the relays, such as the electromagnetic relays, used in other fields are not satisfactory when included in systems for testing the operation of semiconductor chips.

It has been appreciated for some time that it would be desirable to micromachine relays from materials such as semiconductor materials. If fabricated properly, these relays would provide certain advantages. They would be small and would consume minimal amounts of energy. They would be capable of being manufactured at relatively low cost. They would be operated by electrostatic fields rather than electromagnetic fields so that the effect of the electrostatic field of each relay would be relatively limited in space. They would be operative at high frequencies.

Many attempts have been made, and considerable amounts of money have been expended, over a substantial number of years to produce on a practical basis electrostatically operated micro-miniature relays using methods derived from micro-machined pressure transducers and accelerometers. These methods have been used because pressure transducers and accelerometers have been produced by micro-machining methods. In spite of such attempts and such expenditures of money, a practical micro-miniature relay capable of being produced commercially, rather than on an individual basis in the laboratory, and capable of providing a miniature size, a high frequency response and low consumption of power has not yet been provided.

The work thus far in micro-machined pressure transducers, accelerometers and relays has been set forth in "Microsensors" edited by Richard S. Miller and published in 1990 by the IEEE Press in New York City. The chapter entitled "Silicon as a Mechanical Medium" by Kurt E. Peterson on pages 39–76 of this publication are especially pertinent. Pages 69–71 of this chapter summarize the work performed until 1990 on micromachined relays. These pages include FIGS. 57–61.

The relays discussed in the IEEE publication have been demonstrated to function at times in the laboratory but they have difficulties which prevent them from being used in practice. For example, they employ cantilever techniques in producing a beam which pivots on a fulcrum to move from an open position to a closed position. The cantilever beam generally employed should be free from residual stress since a curl in the cantilever beam in either of two opposite directions will result in either a stuck-shut or a stuck-open relay. Very small changes in the temperature of providing the depositions for the cantilever beam or in the gas composition or the die positions can produce these stresses. These curls in the cantilever beam are illustrated in FIG. 59 on page 70 of the IEEE publication.

Relays made by the micro-machining methods discussed in the IEEE publication exhibit a large number of stuck-open contacts. The difficulties result from the small forces available from electrostatic attraction. Although these forces are sufficient to move the movable contact into engagement with the stationary contact, they are insufficient to produce an engagement between the electrically conductive materials on the contacts. This results from the fact that there may be a thin layer of contamination on each of the contacts. Such contamination may result in part from traces of photoresist from the contacts. Removal of these traces of photoresist from the contacts has not been possible because of the small clearances between the contacts. These small clearances have been in the order of micro inches.

The small clearances between the movable and stationary contacts in the prior art micromachined relays have been shielded from plasma bombardment for cleaning purposes. They have also tended to retain the solvent carrying a residue of photoresist from capillary action. Furthermore, the contacts have tended to build insulating layers from pressure-induced polymerization of atmospheric vapors. Thus, particles as small as one micrometer in diameter can prevent the electrically conductive material in the contacts from engaging at the forces produced by the electrostatic field between the contacts. This is discussed on pages 172–174 of "Electrical Contacts" prepared by Ragnar Holm and published by Springer-Verlag, Berlin/Heidelberg.

This invention provides a micro-machined relay which overcomes the disadvantages discussed in the previous paragraphs. The micromachined relay has been produced in a form capable of being provided commercially since wafers each containing a substantial number of such relays have been fabricated, the relays being fabricated on the wafers by micro-machining methods which have been commonly used in other fields. When the relays have been tested, they have been found to operate properly in providing an electrical continuity between the movable and stationary contacts in the closed positions of the stationary contacts. Furthermore, the contacts do not become stuck in the closed positions.

In one embodiment of the invention, a bridging member extends across a cavity in a semiconductor substrate (e.g. single crystal silicon). The bridging member has successive layers—a masking layer, an electrically conductive layer (e.g. polysilicon) and an insulating layer (e.g. $SiO_2$). A first electrical contact (e.g. gold coated with ruthenium) extends on the insulating layer in a direction perpendicular to the extension of the bridging member across the cavity. A pair of bumps (e.g. gold) may be disposed on the insulating layer each between the contact and one of the opposite cavity ends. Initially the bridging member and then the contact and the bumps are formed on the substrate and then the cavity is etched in the substrate through holes in the bridging member.

A pair of second electrical contacts (e.g. gold coated with ruthenium) are on the surface of an insulating substrate (e.g. pyrex glass) adjacent the semiconductor substrate. The two substrates are bonded after the contacts are cleaned. The first contact is normally separated from the second contacts because the bumps engage the adjacent surface of the insulating substrate. When a voltage is applied between an electrically conductive layer on the insulating substrate surface and the polysilicon layer, the bridging member is deflected so that the first contact engages the second contacts.

Electrical leads extend on the surface of the insulating substrate from the second contacts to bonding pads disposed adjacent a second cavity in the semiconductor substrate. The resultant relays on a wafer may be separated from the wafer by sawing the semiconductor and insulating substrates at the position of the second cavity in each relay to expose the pads for electrical connections.

In the drawings:

FIG. 2 is a fragmentary elevational view similar to that shown in FIG. 1 with the two (2) substrates bonded to define an operative embodiment and with the electrical contacts in an open relationship;

FIG. 3 is a fragmentary elevational view similar to that shown in FIG. 2 with the electrical contacts in a closed relationship;

Figure 1:
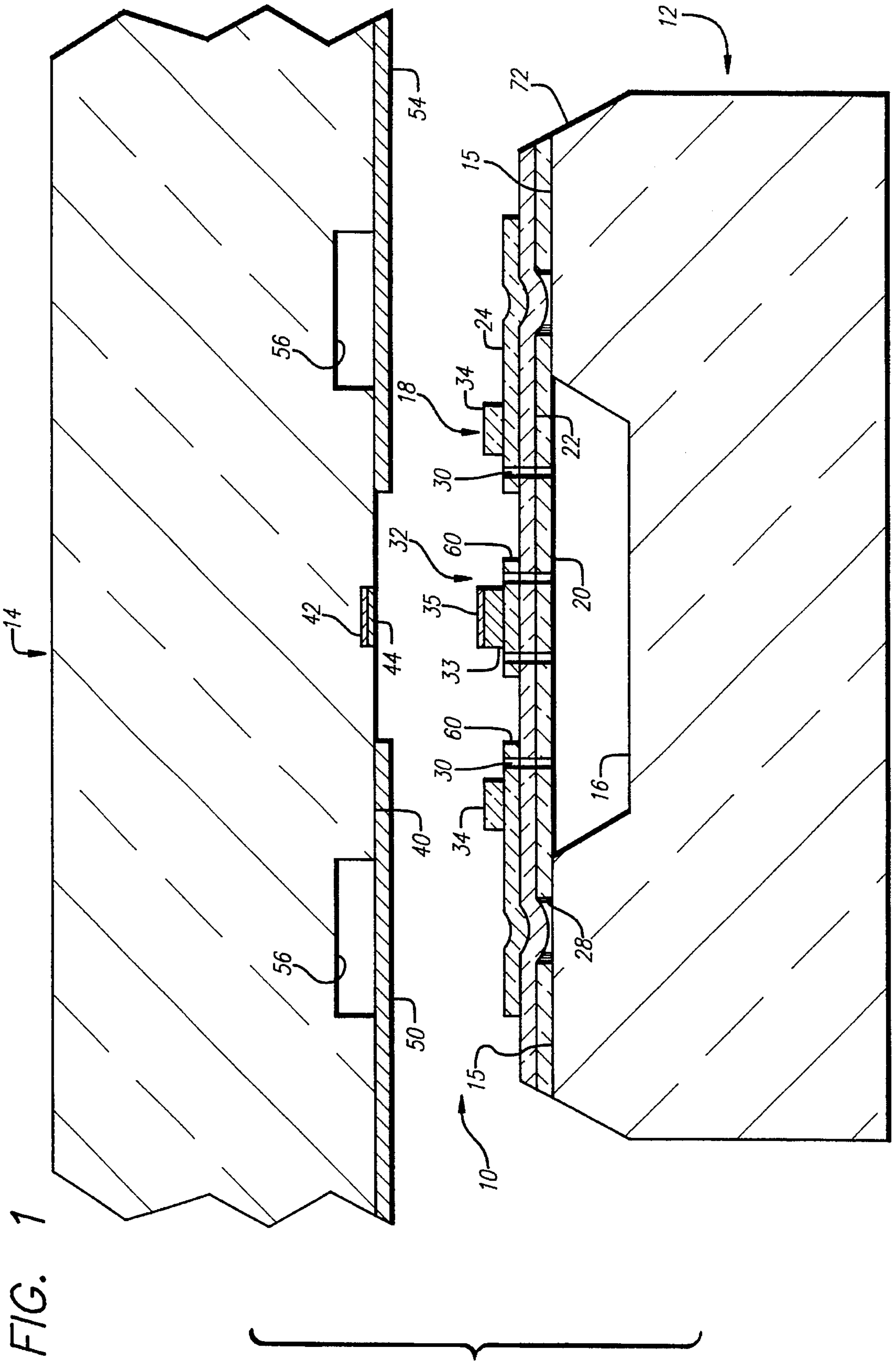
FIG. 1 is an exploded sectional view, taken substantially on the lines 1A—1A of FIG. 4 and the lines 1B—1B in FIG. 5, of a micromachined relay constituting one embodiment of the invention before the two (2) substrates included in such embodiment have been bonded to form the relay.

In one embodiment of the invention, a micromachined relay generally indicated at 10 (FIG. 1) includes a substrate generally indicated at 12 and a substrate generally indicated at 14. The substrate 12 may be formed from a single crystal of a suitable anisotropic semiconductor material such as silicon. The substrate 14 may be formed from a suitable insulating material such as a pyrex glass. The use of anisotropic silicon for the substrate 12 and pyrex glass for the substrate 14 is advantageous because both materials have substantially the same coefficient of thermal expansion. This tends to insure that the relay 10 will operate satisfactorily with changes in temperature and that the substrates 12 and 14 can be bonded properly at elevated temperatures to form the relay.

The substrate 12 includes a flat surface 15 and a cavity 16 which extends below the flat surface and which may have suitable dimensions such as a depth of approximately twenty microns (20μ), a length of approximately one hundred and thirty microns (130μ) (the horizontal direction in FIG. 4) and a width of approximately one hundred microns (100μ) (the vertical direction in FIG. 4). A bridging member generally indicated at 18 extends across the cavity 16. The bridging member 18 is supported at its opposite ends on the flat surface 15.

A masking layer 20, an electrically conductive layer 22 on the masking layer 20 and an insulating layer 24 on the electrically conductive layer 22 are disposed in successive layers to form the bridging layer 18. The layers 20 and 24 may be formed from a suitable material such as silicon dioxide and the electrically conductive layer 22 may be formed from a suitable material such as a polysilicon. The layer 22 may be doped with a suitable material such as arsenic or boron to provide the layer with a sufficient electrical conductivity to prevent any charge from accumulating on the layer 24. The masking layer 20 prevents the electrically conductive layer 22 from being undercut when the cavity 16 is etched in the substrate 12. The layers 20, 22 and 24 may respectively have suitable thicknesses such as approximately one micron (1μ), one micron (1μ), and one micron (1μ). The masking layer 20 may be eliminated wholly or in part without departing from the scope of the invention.

Figure 4:
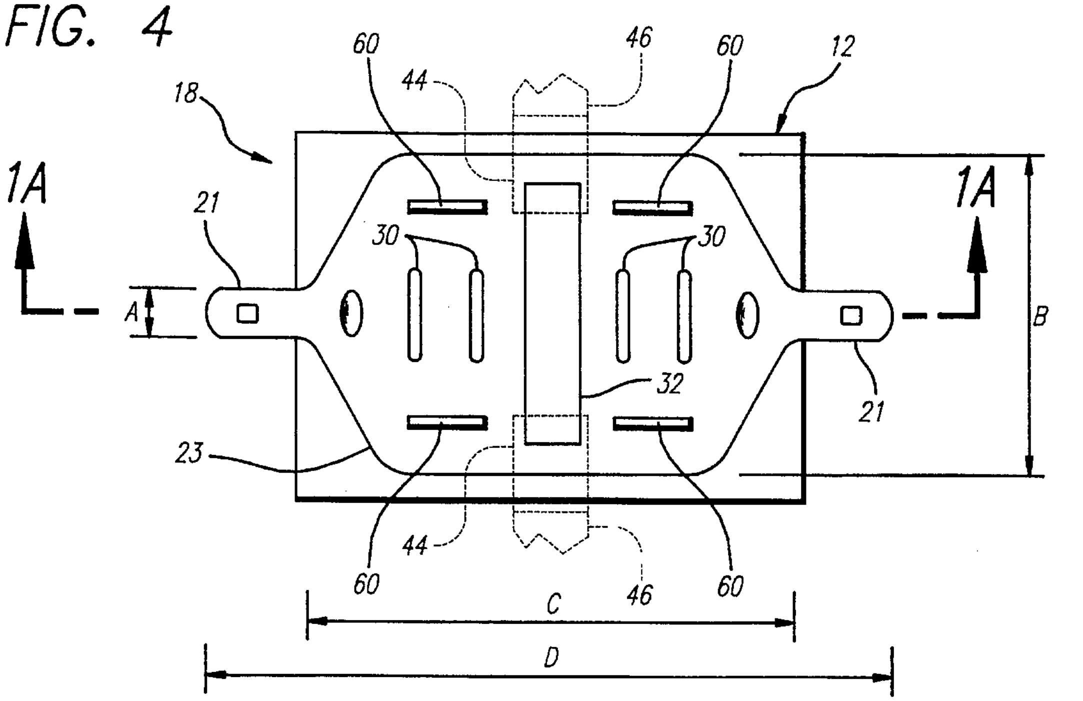
FIG. 4 is a plan view of components included in one of the substrates, these components including a bridging member holding one of the electrical contacts in the relay.

As will be seen in FIG. 4, the parameters of the bridging member 18 may be defined by several dimensions which are respectively indicated at A, B, C and D. In one embodiment of the invention, these dimensions may be approximately twenty four microns (24μ) for the dimension A, approximately ninety microns (90μ) for the dimension B, approximately one hundred and forty four microns (144μ) for the dimension C and approximately two hundred and fifty four microns (254μ) for the dimension D.

As will be seen, the bridging member 18 has the configuration in plan view of a ping pong racket 23 with relatively thin handles 21 at opposite ends instead of at one end as in a ping pong racket. The handles 21 are disposed on the flat surface 15 of the substrate 12 to support the bridging member 18 on the substrate. As will be seen, the configuration of the bridging member provides stability to the bridging member and prevents the bridging member from curling. This assures that an electrical contact on the bridging member 18 will engage electrical contacts on the substrate 14 in the closed position of the switch 10, as will be described in detail subsequently.

The layer 20 may be provided with openings 28 (FIGS. 1–3) at positions near its opposite ends. The openings may be provided with dimensions of approximately six microns (6μ) in the direction from left to right in FIGS. 1–3. The polysilicon layer 22 and the insulating layer 24 may be anchored in the openings 28. This insures that the bridging member 18 will be able to be deflected upwardly and downwardly in the cavity 16 while being firmly anchored relative to the cavity.

The layers 20, 22 and 24 may be provided with holes 30 (FIG. 4) at intermediate positions along the dimension C of racket portion 23 of the bridging member 18. The function of the holes 30 is to provide for the etching of the cavity 16, as will be discussed in detail subsequently. Each of the holes 30 may be provided with suitable dimensions such as a dimension of approximately fifty microns (50μ) in the vertical direction in FIG. 4 and a dimension of approximately six microns (6μ) in the horizontal direction in FIG. 4. The cavity 16 may be etched not only through the holes 30 but also around the periphery of the bridging member 18 by removing the masking layer 20 from this area.

An electrical contact generally indicated at 32 (FIGS. 1–4) is provided on the dielectric layer 24 at a position intermediate the length of the cavity 16. The contact 32 may be formed from a layer 33 of a noble metal such as gold coated with a layer 35 of a noble metal such as ruthenium. Ruthenium is desirable as the outer layer of the contact 32 because it is hard, as distinguished from the ductile properties of gold. This insures that the contact 32 will not become stuck to electrical contacts on the substrate 14 upon impact between these contacts. If the contact 32 and the contacts on the substrate 14 become stuck, the switch formed by the contacts cannot become properly opened.

The contact 32 may have a suitable width such as approximately eighty microns (80μ) in the vertical direction in FIGS. 1–4 and a suitable length such as approximately ten microns (10μ) in the horizontal direction in FIG. 4. The thickness of the gold layer 33 may be approximately one micron (1μ) and the thickness of the ruthenium layer 35 may be approximately one half of a micron (0.5μ).

Bumps 34 (FIG. 1) may also be disposed on the insulating layer 24 at positions near each opposite end of the cavity 16. Each of the bumps 34 may be formed from a suitable material such as gold. Each of the bumps 34 may be provided with a suitable thickness such as approximately one tenth of a micron (0.1μ) and a suitable longitudinal dimension such as approximately four microns (4μ) and a suitable width such as approximately eight microns (8μ). The position of the bumps 34 in the longitudinal direction controls the electrical force which has to be exerted on the bridging member 18 to deflect the bridging member from the position shown in FIG. 2 to the position shown in FIG. 3.

The substrate 14 has a smooth surface 40 (FIGS. 1–3) which is provided with cavities 42 to receive a pair of electrical contacts 44. Each of the contacts 44 may be made from a layer of a noble metal such as gold which is coated with a layer of a suitable material such as ruthenium. The layer of gold may be approximately one micron (1μ) thick and the layer of ruthenium may be approximately one half of a micron (0.5μ) thick. The layer of ruthenium in the contacts 44 serves the same function as the layer of ruthenium 35 in the contact 32.

By providing the cavities 42 with a particular depth, the ruthenium on each of the contacts 44 may be substantially flush with the surface 40 of the substrate 14. The contacts 44 are displaced from each other in the lateral direction (the vertical direction in FIG. 4) of the relay 10 to engage the opposite ends of the contact 32. Electrical leads **46*a* and 46*b* (FIG. 5) extend on the surface 40 of the substrate 14 from the contacts 44 to bonding pads 48*a* and 48*b***.

Figure 5:
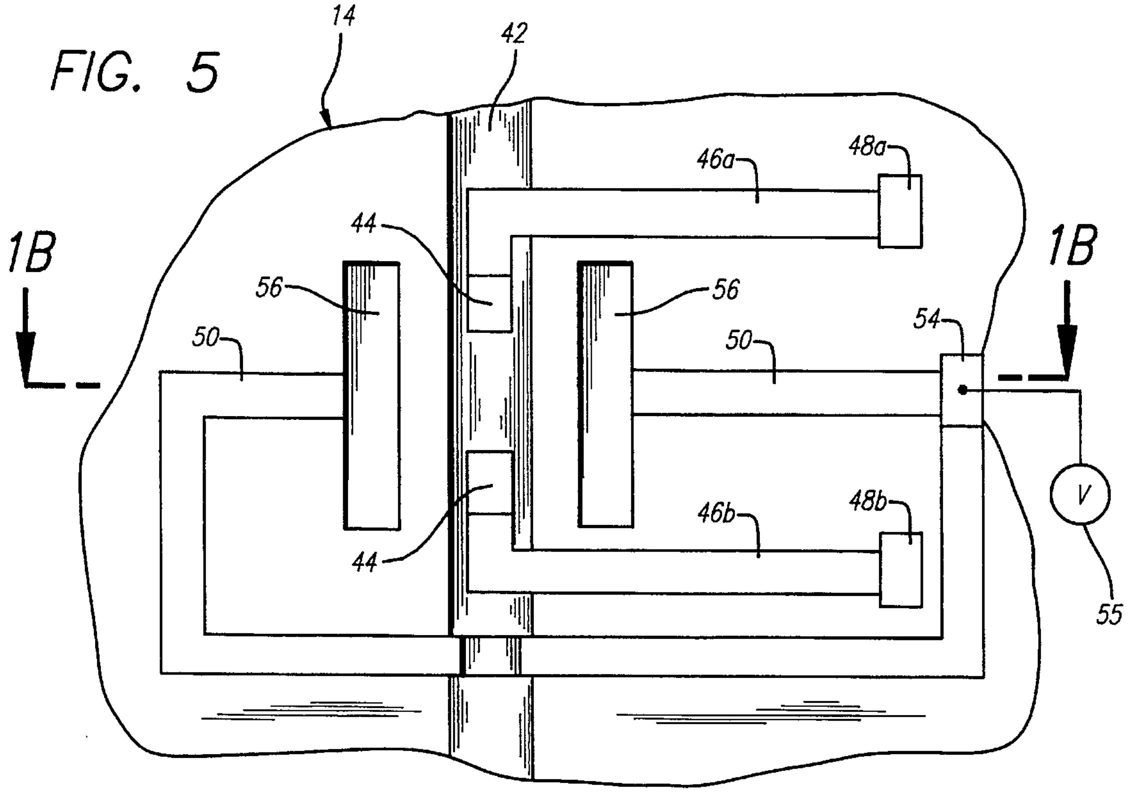
FIG. 5 is a schematic plan view of components in the other substrate and schematically shows the electrical leads and bonding pads for individual ones of the electrical contacts in the relay and the electrical lead and bonding pad for introducing an electrical voltage to the relay for producing an electrostatic field to close the relay.

Electrically conductive layers 50 made from a suitable material such as gold are also provided on the surface 40 of the substrate 14 in insulated relationship with the contacts 44 and the electrical leads 46. The electrically conductive layers 50 extend on the surface 40 of the substrate 14 to a bonding pad 54 (FIG. 5). The bonding pad 54 may be connected to a source of direct voltage 55 which is external to the relay 10.

Cavities 56 (FIGS. 1–3) may be provided in the surface 40 of the substrate 14 at positions corresponding to the positions of the openings 28 in the layer 20. The cavities 56 are provided to receive the polysilicon layer 22 and the insulating layer 24 so that the surface 15 of the substrate 12 will be flush with the surface 40 of the substrate 14 when the substrates 12 and 14 are bonded to each other to form the relay 10. This bonding may be provided by techniques well known in the art. For example, the surface 15 of the substrate 12 and the surface 40 of the substrate 14 may be provided with thin gold layers which may be bonded to each other. Before the substrates 12 and 14 are bonded to each other, a vacuum or other controlled atmosphere may be formed in the cavity 16 by techniques well known in the art. The surfaces of the contacts 32 and 44 are also thoroughly cleaned before the surface of the substrate 12 and the surface 40 of the substrate 44 become bonded.

When the substrates 12 and 14 are bonded to each other, the surface 40 of the substrate 14 engages the bumps 34 to the bridging member 18 and deflects the bridging member downwardly so that the contact 32 is displaced from the contacts 44. This is shown in FIG. 2. When a suitable voltage such as a voltage in the range of approximately fifty volts (50 V) to one hundred volts (100 V.) is applied from the external source 55 to the bonding pad 54 and is introduced to the conductive layers 50, a voltage difference appears between the layers 50 and the polysilicon layer 22, which is effectively at ground. This voltage difference causes a large electrostatic field to be produced in the cavity 16 because of the small distance between the contact 32 and the contacts 44.

The large electrostatic field in the cavity 16 causes the bridging member 18 to be deflected from the position shown in FIG. 2 to the position shown in FIG. 3 so that the contact 32 engages the contacts 44. The engagement between the contact 32 and the contacts 44 is with a sufficient force so that the ruthenium layer on the contact 32 engages the ruthenium layer on the contacts 44 to establish an electrical continuity between the contacts. The hard surfaces of the ruthenium layers on the contact 32 and the contacts 44 prevent the contacts from sticking when the electrostatic field is removed.

When the contact 32 engages the contacts 44, the engagement occurs at the flat surfaces of the contacts. This results from the fact that the bridging member 18 is supported at its opposite ends on the surface 15 of the substrate and is deflected at positions between its opposite ends. It also results from the great width of the bridging member 18 over the cavity 16. These parameters cause the racket portion 23 of the bridging member 18 to have a disposition substantially parallel to the surface 40 of the substrate 14 as the racket portion 23 moves upwardly to provide an engagement between the contact 32 and the contacts 44. Stated differently, these parameters prevent the racket portion 23 from curling as in the prior art. Curling is undesirable because it renders the closing of the contacts 32 and 44 uncertain or renders uncertain the continued closure of the contacts after the contacts have been initially closed.

Since the electrostatic field between the contact 32 and the contacts 44 is quite large such as in the order of megavolts per meter, electrons may flow to or from the insulating layer 24. If these electrons were allowed to accumulate in the cavity 16, they could seriously impair the operation of the relay 10. To prevent this from occurring, the insulating layer 24 may be removed where not needed as at areas 60 so that the polysilicon layer 22 becomes exposed in these areas. The polysilicon layer has a sufficient conductivity to dissipate any charge that tends to accumulate on the insulating layer 24. The isolated areas 60 in the polysilicon layer 22 are disposed in areas on the electrically insulating layer 24 of the bridging member 18 in electrically isolated relationship to the bumps 34 and the contact 32. The charges pulled from or to the dielectric layer 24 are accordingly neutralized by the flow of an electrical current of low amplitude through the polysilicon layer 22.

Figure 6:
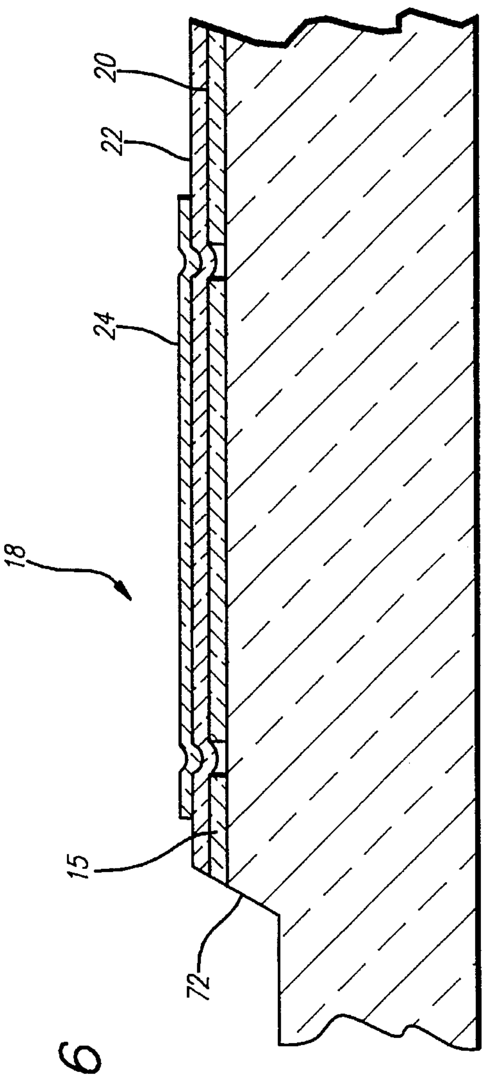
FIG. 6 is an elevational view illustrating one of the substrates shown in FIGS. 1–3 at an intermediate step in the formation of the substrate.

The substrates 12 and 14 may be formed by conventional techniques and the different layers and cavities may be formed on the substrates by conventional techniques. For example, the deposition of metals may be by sputtering techniques, thereby eliminating deposited organic contamination. The bridging member 18 may be formed on the surface 15 of the substrate 12 as shown in FIG. 6 before the formation of the cavity 16. The cavity 16 may thereafter be formed in the substrate by etching the substrate as with an acid through the holes 30 in the bridging member including holes in the masking layer.

A cavity 72 may also be etched in the substrate 12 at the opposite longitudinal ends of the relay 10 at the same time that the cavity 16 is etched in the substrate. The cavity 72 at one longitudinal end is disposed at a position such that the pads **48*a* and 48*b* and the pad 54 (FIG. 5) are exposed. This facilitates the external connections to the pads 48*a* and 48*b* and the pad 54. The cavities 16 and 72 may then be evacuated and the substrates 12 and 14 may be bonded, by techniques well known in the art, at positions beyond the cavities 56. Before the substrates 12 and 14 are bonded, the contacts 32 and 44 may be thoroughly cleaned to assure that the relay will not be contaminated. This assures that the relay will operate properly after the substrates 12 and 14** have been bonded.

Figure 7:
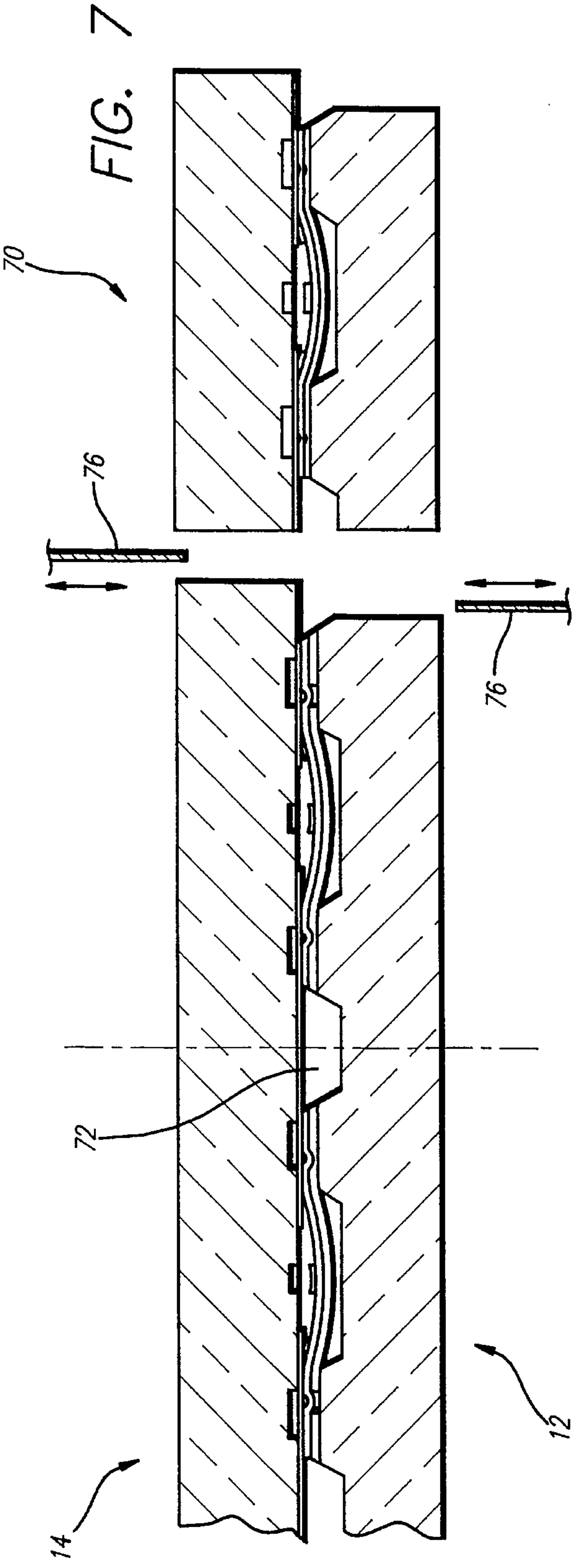
FIG. 7 is a fragmentary schematic elevational view of a wafer fabricated with a plurality of the relays on the wafer with one of the relays individually separated from the wafer.

A plurality of relays 10 may be produced in a single wafer generally indicated at 70 (FIG. 7). When this occurs, one of the cavities 72 (FIGS. 1–3 and 7) may be produced between adjacent pairs of the relays 10 in the wafer 70. The relays 10 may be separated from the wafer 70 at the positions of the cavities 70 as by carefully cutting the wafer as by a saw 76 at these weakened positions. The substrate 12 is cut at a position closer to the cavity 16 than the substrate 14, as indicated schematically in FIG. 7, so that the bonding pads **48*a*, 48*b* and 54 are exposed. In this way, external connections can be made to the pads 48*a*, 48*b* and 54. By forming the relays 10 on a wafer 70**, as many as nine (9) relays may be formed on the wafer in an area having a length of approximately three thousand microns (3000μ) and a width of approximately twenty five hundred microns (2500μ).

The relays 10 of this invention have certain important advantages. They can be made by known micromachining techniques at a relatively low cost. Each relay 10 provides a reliable engagement between the contacts 32 and 44 in the closed position of the contacts without any curling of the contact 32. This results in part from the support of the bridging member 18 at its two (2) opposite ends on the surface 15 of the substrate 12 and from the shaping of the bridging member in the form of a modified ping pong racket. Furthermore, the bumps 34 are displaced outwardly from the contact 32, thereby increasing the deflection produced upon the flexure of the bridging member when the contact 32 moves into engagement with the contacts 44. The wide shape of the bridging member 18 overcomes any tendency for the contact 32 to engage only one of the contacts 44.

The relays are also formed so that any contamination is removed from the relays before the substrates 12 and 14 are bonded. The relays are also advantageous in that the substrates 12 and 14 are bonded and in that the contacts 44 and the pads **48*a*, 48*b* and 54 are disposed on the surface of the substrate 14** in an exposed position to facilitate connections to the pads from members external to the pads.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. In a method of forming a micromachined relay, the steps of:

providing a substrate made from semiconductor material having anisotropic properties, forming bridging means on the substrate with dielectric properties and with properties in the bridging means of withstanding an etchant material, forming at least one hole in the bridging means, applying the etchant material through the hole in the bridging means to etch a cavity in the substrate at positions below the bridging means, with dimensions dependent upon the anisotropic properties of the substrate, to separate a portion of the length of the bridging means from the substrate, and forming an electrical contact on the bridging means at an intermediate position along the separated portion of the length of the bridging means.

2. In the method as set forth in claim 1, including the additional step of:

the cavity constituting a first cavity, forming a second cavity in the substrate at the same time as the formation of the first cavity in the substrate at a position displaced from the first cavity in the substrate.

3. In the method as set forth in claim 1, including the additional steps of:

providing the bridging means with a layer of an electrically conductive material and then with a layer of an insulating material formed on the layer of the insulating material, providing the at least one hole in the layer of the insulating material and the layer of the electrically conductive material, and etching the cavity through the at least one hole in the layer of the insulating material and the layer of the electrically conductive material.

4. In the method as set forth in claim 3, including the additional step of:

removing the layer of the insulating material from the layer of the electrically conductive material at isolated positions on the layer of the electrically conductive material to provide for a dissipation of any electrostatic charge on the layer of the insulating material.

5. In the method as set forth in claim 4, including the additional steps of:

the cavity having opposite peripheries defining the boundaries of the cavity, forming bumps on the bridging means between the electrical contact and the opposite peripheries of the cavity in the substrate, the cavity constituting a first cavity, and etching a second cavity in the substrate at a position displaced from the first cavity.

6. In the method as set forth in claim 1, including the additional step of:

the cavity having opposite peripheries defining the boundaries of the cavity, forming bumps on the bridging means between the electrical contact and the opposite peripheries of the cavity in the substrate.

7. In the method as set forth in claim 6, including the additional step of:

the cavity in the substrate constituting a first cavity, etching a second cavity in the substrate at a position displaced from the first cavity.

8. In a method of forming a micromachined relay, the steps of:

providing a substrate of an insulating material, the substrate having an edge, forming at least a first cavity in the substrate, depositing a pair of electrical contacts in the at least first cavity, providing in the substrate second cavities at positions displaced from the first cavity in the substrate, providing a plurality of electrical leads, each individual one of the plurality of electrical leads having an end and each individual one of the plurality of electrical leads extending on the substrate from the pair of the electrical contacts to the edge of the substrate in electrically insulating relationship to electrical leads other than such individual one of the plurality of electrical leads, and providing bonding pads at the ends of the electrical leads.

9. In the method as set forth in claim 8, including:

the substrate having a first surface, the first cavity being formed in the first surface of the substrate, the pair of electrical contacts having surfaces flush with the first surface.

10. In the method as set forth in claim 9, including the additional steps of:

providing electrically conductive material on the first surface of the substrate in electrically isolated relationship with the pair of electrical contacts and the plurality of electrical leads, and disposing an additional bonding pad on the first surface of the substrate in electrical communication with the electrically conductive material.

11. In the method of forming a micromachined relay as set forth in claim 10, including the additional steps of:

the substrate constituting a first substrate, providing a second substrate of a dielectric material, providing a bridging member on the second substrate, providing a cavity, defined by opposite ends, in the second substrate at a position below the bridging member to provide for a pivotal movement of the bridging member about the ends of the cavity as fulcrums, and forming an electrical contact on the bridging member to provide for an engagement between the electrical contact in the bridging member and the electrical contacts on the substrate of the insulating material in accordance with the pivotal movement of the bridging member.

12. In the method as set forth in claim 11, including the additional steps of:

forming bumps on the bridging member between the electrical contact on the bridging member and the opposite ends of the cavity in the second substrate to displace the electrical contact on the bridging member from the electrical contacts in the cavity on the substrate of the insulating material.

13. In the method as set forth in claim 12, including the additional steps of:

bonding the first substrate of the insulating material and the second substrate of the dielectric material at positions beyond the opposite ends of the cavity in the second substrate.

14. In the method as set forth in claim 13, including the additional steps of:

the leads having opposite ends, providing a second cavity in the second substrate of the dielectric material at the opposite ends of the plurality of electrical leads on the first substrate of the insulating material before the first substrate of the insulating material and the second substrate of the dielectric material are bonded.

15. A method of producing an electrical relay, comprising the steps of:

providing a first substrate with a surface, providing a second substrate with a surface, disposing contacts on the first surface of the first substrate, providing a contact on the first surface of the second substrate, modifying the second substrate to provide for a pivotal movement of the contact on the second substrate into engagement with the contacts on the first substrate, cleaning the contacts on the surface of the first substrate and the contact on the surface of the second substrate, and bonding the surface of the first substrate to the surface of the second substrate.

16. The method as set forth in claim 15, including the additional step of:

forming a vacuum between the first and second substrates before bonding the surface of the first substrate and the surface of the second substrate.

17. The method as set forth in claim 16 wherein pads are provided on the surface of the second substrate to provide for external connections to the pads and wherein the pads communicate electrically with the contacts on the surface of the first substrate and wherein the second substrate is modified by forming a cavity in the second substrate around the contact on the surface of the second substrate to provide for a pivotal movement of the contact on the surface of the second substrate into engagement with the contacts on the surface of the first substrate and wherein the contact on the surface of the second substrate is disposed on a bridging member movable relative to the contacts on the surface of the first substrate to produce the engagement between the contact on the surface of the second substrate and the contacts on the surface of the first substrate and wherein the bridging member is constructed to dissipate any electrical charges accumulated on the bridging member.

18. The method as set forth in claim 17 wherein the bridging member is formed from an electrically conductive layer and an electrically insulating layer on the electrically conductive layer and wherein holes are provided in the electrically conductive layer and the electrically insulating layer of the bridging member to facilitate the formation of the cavity in the second substrate.

19. The method as set forth in claim 18 wherein the cavity has opposite ends defining the boundaries of the cavity and wherein the electrically insulating layer is removed from the electrically conductive layer at isolated positions to facilitate the removal of electrostatic charges in the space between the contact on the surface of the second substrate and the contacts on the surface of the first substrate and wherein bumps are disposed on the electrically insulating layer between the contact on the surface of the second substrate and the opposite ends of the cavity to maintain the electrical contact on the surface of the second substrate displaced from the electrical contacts on the surface of the first substrate until the creation of an electrical field between the contacts on the surface of the second substrate and the contacts on the surface of the first substrate.

20. The method as set forth in claim 15, wherein the second substrate is modified by forming a cavity in the second substrate around the contact on the surface of the second substrate to provide for the pivotal movement of the contact on the surface of the second substrate into engagement with the contacts on the surface of the first substrate.

21. In a method as set forth in claim 20, the first and second substrates being evacuated of gases.

22. The method as set forth in claim 15 wherein pads are provided on the surface of the second substrate to provide for external connections to the pads and wherein the pads communicate electrically with the contacts on the surface of the first substrate.

23. The method as set forth in claim 15 wherein the contact on the surface of the second substrate is disposed on a bridging member movable relative to the contacts on the surface of the first substrate to produce the engagement between the contact on the surface of the second substrate and the contacts on the surface of the first substrate and wherein the bridging member is constructed to dissipate any electrical charges accumulated on the bridging member.

24. In a method of forming a micromachined relay, the steps of:

providing a substrate made from semiconductor material having anisotropic properties, forming bridging means on the substrate with dielectric properties in the bridging means and with properties in the bridging means of withstanding etchant materials, etching a cavity in the substrate at positions below the bridging means, with dimensions dependent upon the anisotropic properties of the substrate, to separate a portion of the length of the bridging means from the cavity, and forming an electrical contact on the bridging means at an intermediate position along the separated portion of the length of the bridging means.

25. In the method as set forth in claim 24, including the additional step of:

the cavity constituting a first cavity, forming a second cavity in the substrate at the same time as the formation of the first cavity in the substrate at a position displaced from the first cavity in the substrate.

26. In the method as set forth in claim 24, including the additional steps of:

initially providing the bridging means with a layer of an electrically conductive material and then with a layer of an electrically conductive material on the layer of the insulating material before the etching of the cavity in the substrate.

27. In the method as set forth in claim 24, including the additional step of:

removing the layer of the insulating material from the layer of the electrically conductive material at isolated positions on the layer of the electrically conductive material to provide for a dissipation of any electrostatic charge on the layer of the insulating material.

28. In the method as set forth in claim 24, including the additional step of:

forming bumps on the bridging means between the electrical contact and the opposite peripheries of the cavity in the substrate.

29. In the method as set forth in claim 28, including the additional step of:

the cavity in the substrate constituting a first cavity, etching a second cavity in the substrate at a position displaced from the first cavity.

30. In the method as set forth in claim 28, including the additional steps of:

the cavity having opposite peripheries defining the boundaries of the cavity, forming bumps on the bridging means between the contact and the opposite peripheries of the cavity in the substrate, the cavity constituting a first cavity, and etching a second cavity in the substrate at a position displaced from the first cavity.

31. In the method as set forth in claim 30, the additional steps of:

initially providing the bridging means with a layer of an electrically conductive material and then with a layer of an insulating material on the layer of the insulating material before the etching of the cavity in the substrate, removing the layer of the insulating material from the layer of the electrically conductive material at isolated positions on the layer of the electrically conductive material to provide for a dissipation of any electrostatic charge on the layer of the insulating material.

* * * * *